United States Patent [19]

Suguro

[11] Patent Number: 4,959,745

[45] Date of Patent: Sep. 25, 1990

[54] CAPACITOR AND METHOD FOR PRODUCING THE SAME

[75] Inventor: Kyoichi Suguro, Yokohama, Japan

[73] Assignee: Kabushiki Kaisha Toshiba, Kawasaki, Japan

[21] Appl. No.: 319,342

[22] Filed: Mar. 6, 1989

[30] Foreign Application Priority Data

Mar. 4, 1988 [JP] Japan .................................. 63-049736

[51] Int. Cl.$^5$ .......................... H01G 7/00; H01G 9/00
[52] U.S. Cl. ................................... 361/311; 29/25.42; 361/523
[58] Field of Search ............................ 29/25.42, 570.1; 361/311–313, 523–525; 427/255, 255.3, 102, 96, 39, 38; 357/91

[56] References Cited

U.S. PATENT DOCUMENTS

| | | | |
|---|---|---|---|
| 3,274,025 | 9/1966 | Ostis | 361/311 |
| 3,579,063 | 5/1971 | Wasa et al. | 361/313 |
| 3,819,990 | 6/1974 | Hayashi et al. | 361/313 |
| 4,464,701 | 8/1984 | Roberts et al. | 361/313 |
| 4,784,975 | 11/1988 | Hofmann et al. | 357/91 X |

FOREIGN PATENT DOCUMENTS 61-265856  11/1986  Japan.

*Primary Examiner*—Donald A. Griffin
*Attorney, Agent, or Firm*—Foley & Lardner, Schwartz, Jeffery, Schwaab, Mack, Blumenthal & Evans

[57] ABSTRACT

A capacitor including a dielectric film of a metal oxide, in which two electrodes contact with the surfaces of the dielectric film, and at least one of the electrodes is a conductive metal compound to which oxygen is added. A method for producing the capacitor is also disclosed.

6 Claims, 6 Drawing Sheets

CAPACITOR AND METHOD FOR PRODUCING THE SAME

BACKGROUND OF THE INVENTION

1. Field of the Invention

The present invention relates to a capacitor to be used in LSI, VLSI and ULSI chips or the like, which possesses a high dielectric constant and reduces a leakage current, and a method for producing the capacitor.

2. Description of the Background Art

A conventional dynamic RAM (dRAM), for example, includes a plurality of memory cells, each cell comprising a MOSFET and a capacitor, which are highly integrated to produce an LSI. In the LSI of this kind, a flat surface capacitor using a silicon dioxide ($SiO_2$) film as a dielectric substance has been widely employed in the conventional capacitor. However, as the LSI has been more highly integrated, it has become difficult to cope with this high integration by only reducing the thickness of the $SiO_2$ film of the capacitor, because the area of the capacitor is almost the same.

In order to solve this problem, silicon nitride ($Si_3N_4$) film having a higher dielectric constant than that of the $SiO_2$ film is used in combination with the $SiO_2$ film in the form of a lamination structure such as a two layer laminate film of $SiO_2$ film—$Si_3N_4$ film, a three layer laminate film of $SiO_2$ film—$Si_3N_4$ film—$SiO_2$ film and the like. However, the film thicknesses of these lamination films are approximately at most 5 nm in terms of the $SiO_2$. In the very large scale integrated circuit (VLSI), the development of a dielectric substance having a higher dielectric constant has been demanded.

Now, research and development of a metal oxide of tantalum pentoxide ($Ta_2O_5$) is most widely conducted for reason that the relative dielectric constant of $Ta_2O_5$ is approximately 25 to 30 which is 6 to 8 times of that of the $SiO_2$ or is 3 to 4 times of that of the $Si_3N_4$. Hence, the thickness of the $Ta_2O_5$ film can be thickened by the magnifying rate of the relative dielectric constant when the same capacitance as that of the $SiO_2$ or $Si_3N_4$ is to be obtained, to readily produce a film having less deficiency and to reduce an electric field when the same voltage is applied, resulting in reducing a load or charge given to an insulating film. Further, the tantalum (Ta) is one of materials whose refining techniques are most developed and high purity can be readily obtained. As to these high purity materials rather than the tantalum, for instance, titanium (Ti) itself has a high relative dielectric constant, but, since the oxide of Ti contains a metastable phase, a composition slip is apt to arise in the normal composition of $TiO_2$, and the probability of the oxygen omission is high. Hence, the electric insulating property of $TiO_2$ is inferior than that of $Ta_2O_5$, and now the research and development of $Ta_2O_5$ move on to practical use.

When the $Ta_2O_5$ having such a high dielectric constant is formed on the silicon (Si) in the form of a thin film, its relative dielectric constant is reduced as the film is formed thinner. For instance, when the $Ta_2O_5$ with a thickness of 20 nm is deposited, its effective relative dielectric constant is required to a low value such as 12 to 14.5 on account of a film of $SiO_2$ or $TaSi_xO_y$ having a low dielectric constant, which is produced at an interface therebetween. In particular, when the tantalum target is sputtered in a mixture gas atmosphere of argon (Ar) and oxygen (O) to deposit a $Ta_2O_5$ film onto the silicon, the $SiO_2$ is formed at the interface between the Si and the $Ta_2O_5$ film. It is considered that the $SiO_2$ is formed by the oxygen plasma in the plasma oxidation process. It is understood that the relative dielectric constant of the $Ta_2O_5$ deposited on molybdenum (Mo) or platinum (Pt) does not depend on the thickness thereof. It is also understood that the $Ta_2O_5$ has the same behavior on tungsten (W). Accordingly, when a metallic electrode is used, a high relative dielectric constant such as 25 to 30 can be obtained. However, when a metal film is deposited by a vapor deposition or sputtering, the higher the purity of the metal film, the more liable the metal film is formed in a needle crystal. For example, the leakage current of the sputtered $Ta_2O_5$ film grown on the finely rough surface of the base metal film becomes large. It is considered that this problem is caused by the uneven thickness of the $Ta_2O_5$ film and the electric field concentration effect due to the needle crystal.

In order to improve this problem, the roughness of the surface of the base electrode is reduced, as disclosed in Japanese Patent Laid-Open Specification No. 61-265856. This is performed by forming an amorphous structure by introducing oxygen or argon into the base electrode when or after the electrode is formed, or forming a quite thin thickness such as several nm of the base electrode, or forming relatively large particles in the base electrode by a heat treatment at a high temperature. Although these countermeasures achieve success to a certain extent, however, it is difficult to always obtain a stable reproducibility. Thus, a problem of reliability arises in a very large scale integrated circuit such as a 4M-dRAM, a 16M-dRAM or a larger scale dRAM. In order to ensure a higher reliability, the surface of the base electrode is to be positively smoothed and it is necessary to employ a structure which is capable of maintaining a chemical stability between a dielectric film and upper and lower electrodes.

In a conventional three-layer capacitor of a metal-high dielectric film-metal structure, the large leakage current is attributable to the uneven thickness of the high dielectric film due to the rough surface of the base electrode, and to the electric field concentration effect due to the uneven surface of the base electrode. Further, there exist silicides, nitrides, borides and carbides of metals, which do not react with the silicon semiconductor in a process at a high temperature of at least 650° C. However, when a pure chemical compound contacts a metal oxide at a high temperature, the former takes the oxygen from the latter to deteriorate the insulation property of the metal oxide. In the conventional countermeasures for reducing the leakage current, no sufficient effects can be obtained so far in the LSI, the VLSI the ULSI or the like.

SUMMARY OF THE INVENTION

It is therefore an object of the present invention to provide a capacitor, free from the aforementioned defects and disadvantages of the prior art, which possesses a high dielectric constant and reduces a leakage current for use suitably in integrated circuits such as LSI, VLSI and ULSI.

It is another object of the present invention to provide a method for producing a capacitor, free from the aforementioned defects and disadvantages of the prior art, the capacitor having a high dielectric constant and reducing a leakage current for use suitably in integrated circuits such as LSI, VLSI and ULSI.

In accordance with one aspect of the invention, there is provided a capacitor comprising a dielectric film of a metal oxide and two electrodes contacting with surfaces of the dielectric film, at least one of the electrodes being a conductive metal compound to which oxygen is added.

In accordance with another aspect of the invention, there is provided a method for producing a capacitor, comprising employing a conductive metal compound for at least one of electrodes which contact with surfaces of a dielectric film of a metal oxide and adding oxygen to the at least one of the electrodes during the formation thereof from the conductive metal compound.

The conductive metal compound is at lease one of nitrides, borides, carbides and silicides of titanium, zirconium, hafnium, niobium and tantalum, and silicides and nitrides of tungsten and molybdenum. The metal oxide is at least one of tantalum, niobium, titanium, zirconium, hafnium and yttrium. The resistivity of the conducive metal compound to which the oxygen is added, is at most 1 k$\Omega$·/cm.

BRIEF DESCRIPTION OF THE DRAWINGS

These and other objects, features and advantages of the present invention will more fully appear from the following description of the preferred embodiments thereof with reference to the accompanying drawings, in which.

DESCRIPTION OF THE PREFERRED EMBODIMENTS

Figure 1A:
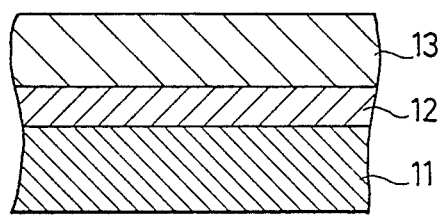
FIGS. 1a to 1c are longitudinal cross sectional views illustrating typical three-layer laminate capacitors of an upper electrode-dielectric film-lower electrode structure according to the present invention.

Referring now to the drawings, there are shown in FIG. 1 embodiments of capacitors according to the present invention.

Figure 1B:
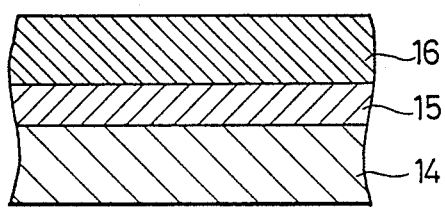
Figure 1C:
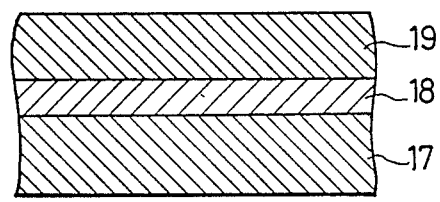

In FIG. 1a, a three-layer laminate capacitor comprises a lower electrode 11 of a conductive metal compound film to which oxygen is added, a dielectric film 12 of a metal oxide, deposited on the lower electrode 11, and an upper electrode 13 of a conductive film formed on the dielectric film 12. In FIG. 1b, another three-layer laminate capacitor comprises a lower electrode 14 of the conductive film, a dielectric film 15 of the metal oxide deposited on the lower electrode 14, and an upper electrode 16 of the conductive metal compound film to which the oxygen is added. In FIG. 1c, still another three-layer laminate capacitor comprises a dielectric film 18 of the metal oxide and lower and upper electrodes 17 and 19 of the conductive metal compound film to which the oxygen is added.

In this case, the conductive metal compound is at least one of nitrides, borides, carbides and silicides of titanium (Ti), zirconium (Zr), hafnium (Hf), niobium (Nb) and tantalum (Ta), and silicides and nitrides of tungsten (W) and molybdenum (Mo). The metal oxide is at least one of Ta, Nb, Ti, Zr, Hf and yttrium (Y). The conductive metal compound to which the oxygen is added, is used for making at least one of the lower and upper electrodes. It is considered that by adding the oxygen to the conductive metal compound, the robbing of the oxygen from the metal oxide dielectric film can be effectively prevented by the conductive metal compound to which the oxygen is added, during the heat treatment at the high temperature. The adding amount of the oxygen is properly determined in a range in which the electrode material itself has a larger conductivity than that of a semiconductor. That is, it is undesirable that the electrodes have properties of the dielectric substance after adding the oxygen to the electrodes. Thus, the resistivity of the conductive metal compound to which the oxygen is added, is at most 1 k$\Omega$·/cm.

Figure 2:
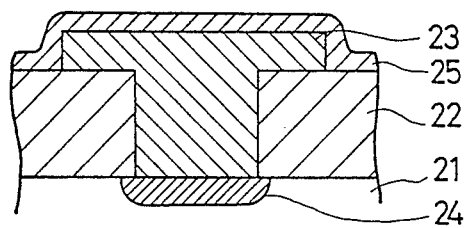
FIG. 2a to 2c are longitudinal cross sectional views a method for producing a capacitor having the structure shown in FIG. 1c.
Figure 2:
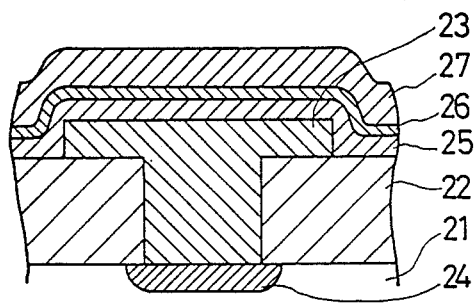
Figure 2:
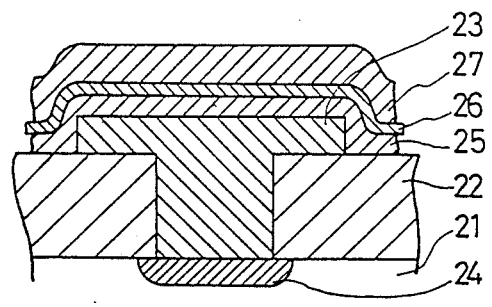

In FIG. 2, there is schematically shown a method for producing a capacitor having the structure shown in FIG. 1c. In FIG. 2a, on a p-type silicon (100) semiconductor substrate 21 having a resistivity of 6$\Omega$·/cm, a SiO$_2$ film 22 of 1 $\mu$m thickness is deposited by a chemical vapor deposition (CVD) method, and then an opening of 0.8 $\mu$m is formed in a stack-type capacitor formation region of the SiO$_2$ film 22 using a photolithography and a reactive ion etching. An arsenic (As)-doped polycrystalline silicon 23 of 0.5 $\mu$m thickness is deposited in the opening portion of the SiO$_2$ film 22 in an LPCVD furnace using AsH$_3$ and SiH$_4$. This step is carried out at a temperature 600° C. of the substrate at a pressure of 0.1 torr during the deposition. A densifying is carried out at 900° C. to reduce the resistance of the polycrystalline silicon 23 and to form an As diffusion region 24 in the substrate 21. A smoothing etching of the polycrystalline silicon 23 is then carried out using NF$_3$ and O$_2$ gases at a flow amount ratio of 1:2.5. This etching is carried out under the conditions of a 600 W of RF power and a pressure of 0.2 torr to perform an etching of approximately 1500Å thickness. Then, the polycrystalline silicon 23 is etched using the photolithography and the reactive ion etching. This etching size is determined to 1.2 $\mu$m in consideration of margins 2×0.2 $\mu$m. Then, a TaN$_x$O$_y$ film 25 of 50 nm thickness as a lower electrode is deposited to cover the entire surface of the polycrystalline silicon 23. This step is carried out in a mixture gas of oxygen, nitrogen and argon by sputtering a 99.9999% of Ta target, and a DC magnetron type sputtering apparatus is used. The flow amount ratio oxygen, nitrogen and argon is 7:20:20. The pressure during the deposition is 0.7 Pa, and the heating temperature of the substrate is 200° C.

In FIG. 2b, by sputtering the Ta target in the mixture gas of oxygen and nitrogen at a flow amount ratio of 50:1, a Ta$_2$O$_5$ film 26 of 20 nm thickness as a dielectric film is formed on the TaN$_x$O$_y$ film 25. Then, a TaN$_x$O$_y$ film 27 of 200 nm thickness is deposited for forming an upper electrode on the Ta$_2$O$_5$ film 26 in the same manner as the deposition of the TaN$_x$O$_y$ film 25. The TaN$_x$O$_y$ film 27 is then etched to approximately 1.5 $\mu$m size using the photolithography and the reactive ion etching. The reactive ion etching is carried out by introducing the NF$_3$ and O$_2$ gases at the flow amount ratio of 2:1. In this etching step, the two TaN$_x$O$_y$ films 25 and 27 are excessively etched at a rate of approximately 15 to 20% to obtain a capacitor of the present invention, as shown in FIG. 2c. The obtained capacitor is then annealed at 800° C. for 60 minutes in the nitrogen gas, and its electric properties are tested.

Figure 3:
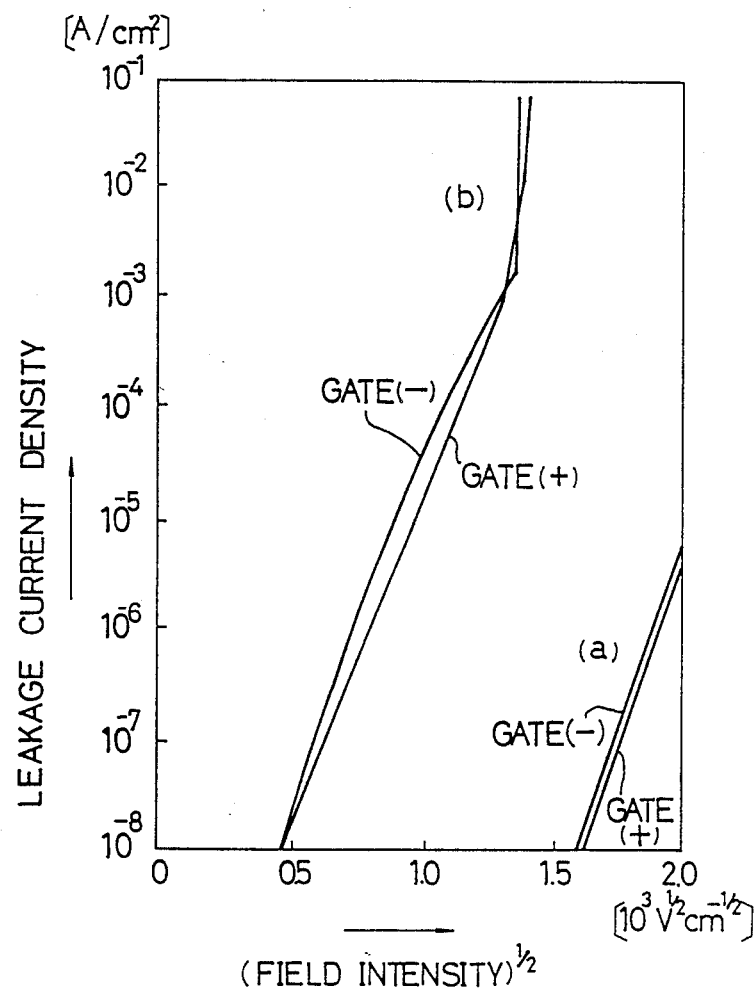
FIG. 3 is a graphical representation showing leakage current property of the capacitor obtained in the method shown in FIG. 2 along with that of a conventional capacitor.

In FIG. 3, there is shown a leakage property (a) of the $Ta_2O_5$ film of the capacitor with 0.1 mm$^2$, obtained in the embodiment shown in FIG. 2, in comparison with that (b) of a conventional capacitor. It is apparent that almost the same results are obtained in both gate sides (+) and (−), and the leakage current of the present capacitor is largely reduced by a factor of 10$^7$ in the same electric field as compared with that of the conventional one. Therefore, by adding the oxygen into the $TaN_xO_y$ films, no problem arises in the chemical stability of the capacitor heat-treated after the deposition of the $Ta_2O_5$ film. In this case, the leakage current per one cell is approximately $1\times 10^{-16}$A at a bias voltage of 5 V, which is lower than a leakage current of $1\times 10^{-15}$A required to the dRAM cell, and the leakage current property of a group of capacitors of 10$^7$ scale is uniformly within ±0.2 MV/cm. The relative dielectric constant of the $Ta_2O_5$ is high such as 28 to 29. Hence, the thickness 20 nm of the $Ta_2O_5$ film is equivalent to 2.7 nm in terms of the $SiO_2$ film to obtain the same capacitance, that is, although the occupancy area of the capacitor is small such as $1.2\times 1.5$ μm$^2$, the large capacitance of more than 25 fF can obtained.

In FIG. 4, there is schematically shown another method for producing a capacitor including lower and upper electrodes of $TiN_xO_y$ and a dielectric film of $Ta_2O_5$ therebetween according to the present invention. In FIG. 4a, in a p-type silicon (100) semiconductor substrate 31 having a resistivity of 5Ω·cm, an n$^+$-type diffusion region 32 is formed in 0.12 μm depth by implanting an ion of As$^+$ at 30 keV energy with a dose of $1\times 10^{15}$ cm$^{-2}$ and then annealing at 850° C. for 60 minutes. A nickel (Ni) film of 30 nm thickness is deposited on the n$^+$-type diffusion region 32 by sputtering, and then an annealing is carried out at 750° C. for 30 minutes to form a region 33 of NiSi$_2$ in 100 nm depth in the upper surface portion of the diffusion region 32. Then, a SiO$_2$ film 34 of 300 nm thickness is deposited on the substrate 31, and an opening A is formed in the SiO$_2$ film 34 in the same manner as the embodiment of FIG. 2.

Figure 4A:
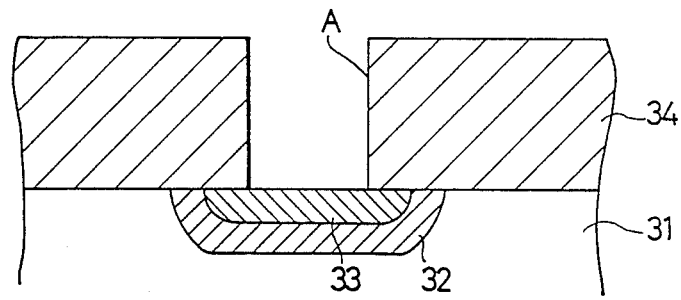
FIG. 4 is a longitudinal cross sectional view showing another method for producing another capacitor according to the present invention.
Figure 4B:
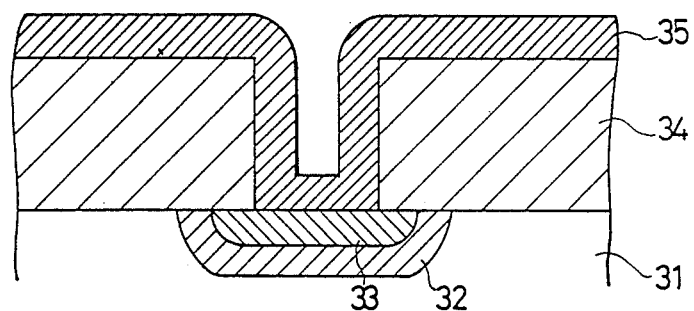
Figure 4C:
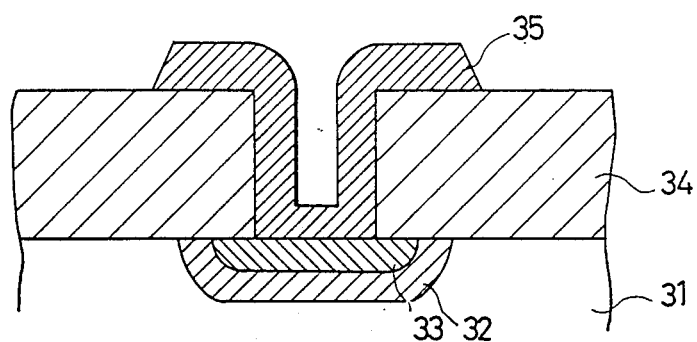
Figure 4D:
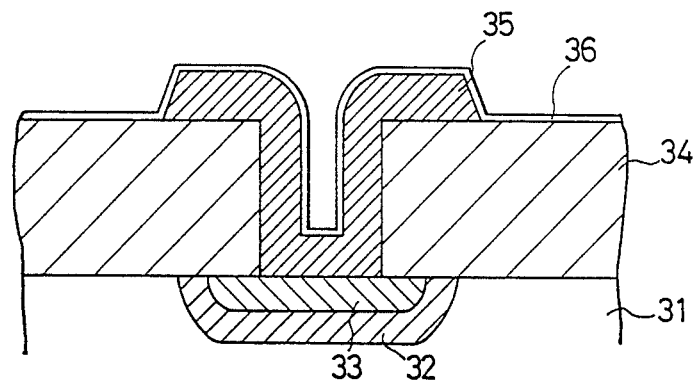
Figure 4E:
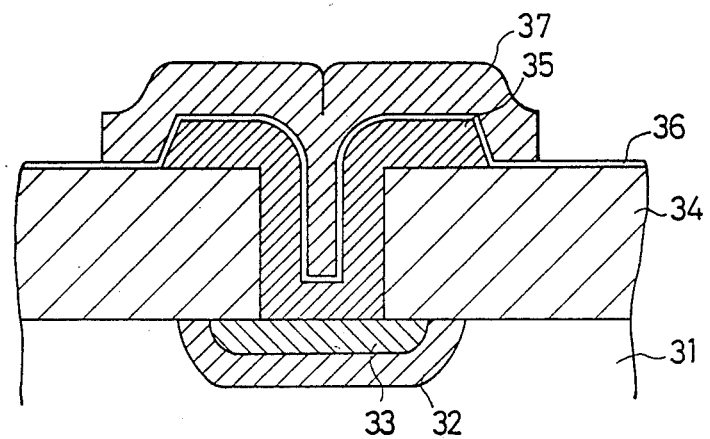

In FIG. 4b, a $TiNO_{0.2}$ film 35 of 200 nm thickness is deposited on the SiO$_2$ film 34 and the NiSi$_2$ region 33 of the substrate 31 by introducing 4N grade of Ti{N(CH$_3$)$_2$}$_4$, N$_2$O and N$_2$ gases at a flow amount ratio of 20:1:20 in the same manner as the embodiment of FIG. 2. This step is carried out at a total pressure of 0.2 torr. In FIG. 4c, the etching of the $TiNO_{0.2}$ film 35 is then carried out using a tapered resist pattern to obtain a lower electrode in the same manner as the previous embodiment. Then, as shown in FIG. 4d, a $Ta_2O_5$ film 36 of 10 nm thickness, including 3 to 5% by weight of Zr, as a dielectric film is deposited on the films 34 and 35 using Ta(OC$_2$H$_5$)$_5$ and Zr(OC$_3$H$_7$)$_4$ gases at a flow amount ratio of 10:1 at 400° C. at a pressure of 0.15 torr to entirely cover the $TiNO_{0.2}$ film 35. In FIG. 4e, a $TiNO_{0.2}$ film 37 for an upper electrode is deposited on the $Ta_2O_5$ film 36 in the same manner as the film 35 described above, and then the film 37 is etched by the reactive ion etching using a chlorine (Cl$_2$) group gas to obtain an upper electrode in the same manner as described above, thereby producing a capacitor according to the present invention.

Figure 5:
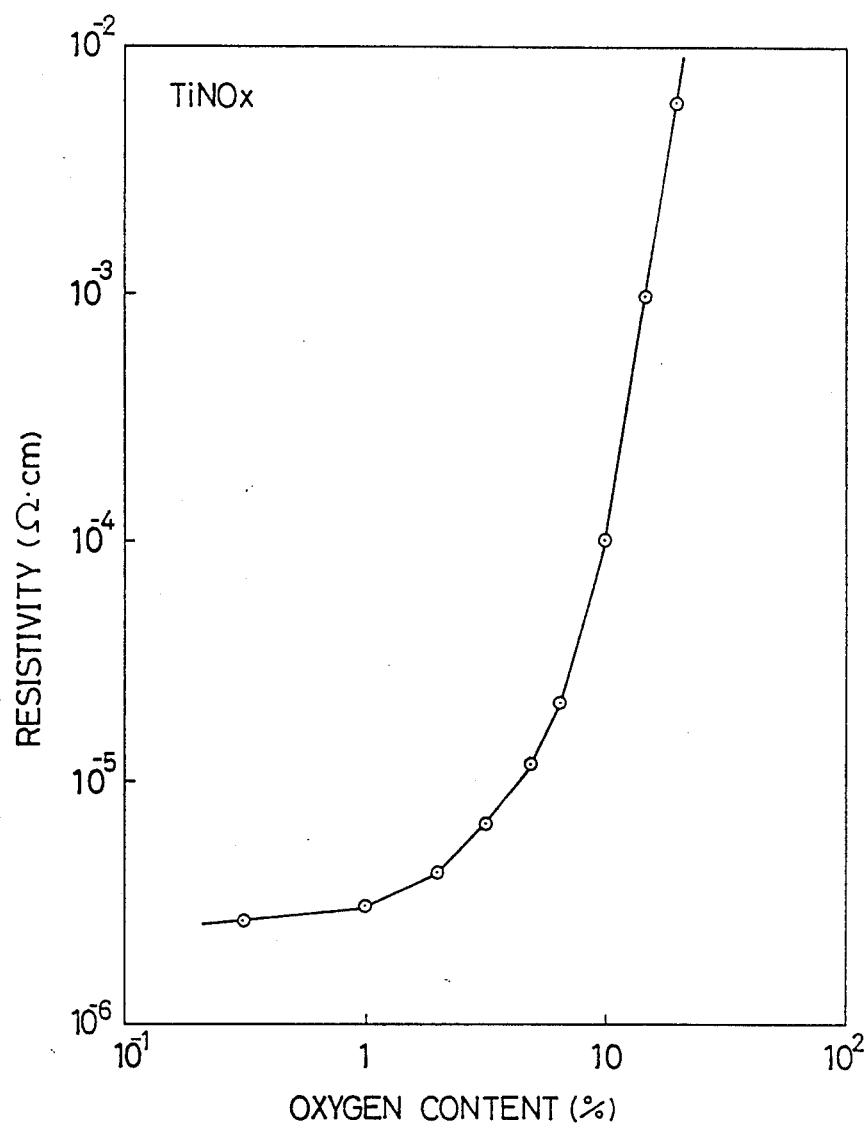
FIG. 5 is a graphical representation showing a relation between oxygen content and resistivity of the capacitor obtained in the method shown in FIG. 4.

In FIG. 5, there is shown a relation between an oxygen content of a TiN film to which oxygen is added at 500° C. using Ti{N(CH$_3$)$_2$}$_4$ and N$_2$O and N$_2$ gases, and the resistivity of the obtained $TiNO_x$ film in the method described above with reference to FIG. 4. As shown in FIG. 5, by adding the oxygen, the desired resistivity of the $TiNO_x$ can be obtained.

As described above, according to the present invention, the chemical stability at the interfaces between the metal oxide dielectric film and the lower and upper electrodes can be ensured. The crystal size of the electrodes is diminished by adding the oxygen, and the surfaces of the electrodes contacting with the dielectric film are smoothed to restrict the electric field concentration effect. Thus, the leakage current of the metal-high dielectric film-metal laminate capacitor can be effectively reduced, and the high relative dielectric constant such as 20 to 30 of the high dielectric film of a very thin thickness such as at most 50 nm can be realized. Accordingly, the capacitors of the present invention can be used in various LSI, VLSI, ULSI and the like such as 16M-dRAM and 64M-dRAM, and the advantages of the small size and large capacity of the capacitors can be effected.

Although the present invention has been described in its preferred embodiment with reference to the accompanying drawings, it is readily understood that the present invention is not restricted to the preferred embodiments and that various changes and modifications of the present invention may be made by a person skilled in the art without departing from the spirit and scope of the present invention.

What is claimed is:

1. A capacitor comprising:
    a dielectric film of a metal oxide; and
    two electrodes contacting with surfaces of the dielectric film, wherein at least one of the electrodes comprises a conductive metal compound having a sufficient amount of added oxygen so as to reduce leakage current resistivity of said conductive metal compound to less than 1000 ohms·/cm, to reduce a crystal size of the electrode and to smooth surfaces of said electrodes contacting said dielectric film to restrict electric field concentration effect.

2. The capacitor of claim 1, wherein the conductive metal compound comprises at least one compound selected from the group consisting of nitrides, borides, carbides and silicides of titanium, zirconium, hafnium, niobium and tantalum, and silicides and nitrides of tungsten and molybdenum.

3. The capacitor of claim 1, wherein the metal oxide comprises at least one of tantalum, niobium, titanium, zirconium, hafnium or yttrium.

4. A method for producing a capacitor having a metal oxide dielectric film disposed between a pair of electrodes, comprising:
    forming at least one of said electrodes with a conductive metal compound comprising at least one compound selected from the group consisting of nitrides, borides, carbides and silicides of titanium, zirconium, hafnium, niobium and tantalum, and silicides and nitrides of tungsten and molybdenum; and
    adding sufficient oxygen to the conductive metal compound during the formation of said electrode in order to prevent a reduction of oxygen included in the dielectric film during a high temperature treatment thereof.

5. The method according to claim 4 further comprising subsequent to the formation of the electrodes, subjecting the resultant structure to a higher temperature treatment.

6. A method for producing a capacitor having a metal oxide dielectric film disposed between a pair of electrodes such that the electrodes contact surfaces of the dielectric film, comprising:
forming at least one of said electrodes with a conductive metal compound comprising at least one compound selected from the group consisting of nitrides, borides, carbides and silicides of titanium, zirconium, hafnium, niobium and tantalum, and silicides and nitrides of tungsten and molybdenum; and
adding sufficient oxygen to the conductive metal compound during the formation of said electrode so as to reduce leakage current resistivity of the conductive metal compound to less than 1000 ohms/cm, to reduce crystal size of the electrodes and to smooth the surfaces of said electrodes contacting said dielectric film to restrict electric field concentration.

* * * * *